(12) United States Patent
Johnson et al.

(10) Patent No.: US 6,677,877 B2
(45) Date of Patent: Jan. 13, 2004

(54) COMPARATOR, ANALOG-TO-DIGITAL CONVERTER AND METHOD OF ANALOG-TO-DIGITAL CONVERSION USING NON-LINEAR MAGNETO-ELECTRONIC DEVICE

(75) Inventors: Mark B. Johnson, Springfield, VA (US); Bill Stapor, Reston, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/113,639

(22) Filed: Mar. 29, 2002

(65) Prior Publication Data

US 2003/0184460 A1 Oct. 2, 2003

(51) Int. Cl.[7] ................................. H03M 1/12
(52) U.S. Cl. .................... 341/155; 144/176; 144/20; 365/171
(58) Field of Search ................... 341/155, 144, 341/15, 176, 20; 365/171

(56) References Cited

U.S. PATENT DOCUMENTS

| | | | |
|---|---|---|---|
| 5,146,201 A | 9/1992 | Kimura et al. | |
| 5,168,274 A | * 12/1992 | Wakamatsu | ................... 341/15 |
| 5,420,587 A | 5/1995 | Michel | |
| 5,629,702 A | 5/1997 | Kovasu et al. | |
| 6,225,933 B1 | * 5/2001 | Salter et al. | ................ 341/144 |
| 6,314,020 B1 | * 11/2001 | Hansen et al. | .............. 365/158 |
| 6,317,359 B1 | 11/2001 | Black | |
| 6,476,453 B2 | * 11/2002 | Hashimoto et al. | ......... 257/393 |

* cited by examiner

Primary Examiner—Michael Tokar
Assistant Examiner—Lam T Mai
(74) Attorney, Agent, or Firm—John J. Karasek; Lawrence G. Legg

(57) ABSTRACT

An analog-to-digital converter for converting an analog input signal to a digital output signal is described. The ADC includes a comparator circuit having first to $n^{th}$ stages of comparators responsive to the analog input signal. Each comparator includes a plurality of magnetoelectronic devices for performing comparison function. Each magnetoelectronic device has one or more ferromagnetic elements capable of being switched into a first or second magnetization states. The amplitude of analog input signal upon exceeding a predetermined threshold level ($I_S$ or $V_S$) of a respective magnetoelectronic device sets a magnetization state of the respective magnetoelectronic device to the first state and the resulting output of the respective magnetoelectronic device to a HIGH state, and vice-versa. In one embodiment, the magnetoelectronic device is a Hybrid Hall Effect device. In another embodiment, the magnetoelectronic device is an isolator.

42 Claims, 9 Drawing Sheets

ANALOG INPUT SIGNAL

COMPARATOR, ANALOG-TO-DIGITAL CONVERTER AND METHOD OF ANALOG-TO-DIGITAL CONVERSION USING NON-LINEAR MAGNETO-ELECTRONIC DEVICE

BACKGROUND OF THE INVENTION

1. Field of the Invention

This invention relates to analog-to-digital converters (ADC), and more particularly, to analog-to-digital converters using non-linear magnetoelectronic apparatus to perform comparison function.

2. Description of Related Art

High speed signal processing, used in numerous applications including telecommunications, involves conversion of analog input signals to digital data streams that are then processed by integrated circuits. The conversion process is typically performed by an analog-to-digital converter (ADC) while the converse process from digital to analog conversion is performed by a digital-to-analog converter (DAC).

The growing development of telecommunications applications that rely on bandwidth, in the range of 0.3 to 3 GHz, has generated a strong need for ADCs that operate in this frequency range, and there is an obvious advantage for ADCs that are fabricated at low cost while operating with low power. For instance, cellular phones typically operate at 2.4 GHz and every cellular phone uses an ADC with a broad band analog input. Likewise, there is a need for ADCs that operate with conversation rates of 1 Gigasamples per second (GSPS) or more to accommodate various receiver functions which are presently limited by existing ADC technology.

The existing approach to analog-to-digital (A/D) conversion is based on semiconductor technology, either CMOS, bi-CMOS, or emitter-coupled logic (ECL), while Flash ADCs are used to achieve highest conversation rates. In each cycle, n-bit digitization process requires that an input signal be sent to $2^n$ comparators (typically $2^n-1$ comparators for n-bits, and 1 comparator for signal flow). The output of the comparators is sampled and sent to decoding circuitry. The conversation speed and power dissipation is typically set by the comparators. CMOS ADCs use OP-AMP comparators, with resistors and capacitors. These passive components impose limits on speed and power. ECL ADCs typically use bipolar transistor circuits as comparators. Although they have faster conversion rates, they dissipate more power. Thus, there is a need to overcome the problems associated with prior approaches.

In the field of magnetism, a variety of magnetoelectronic devices have been developed. Most of these devices, however, utilize the bi-stable magnetization states of a ferromagnetic component for non-volatile storage of digital information. The present invention proposes using nonlinear current-voltage (I–V) characteristics of the magnetoelectronic devices as a low power alternative to existing CMOS technology in order to make them suitable converters for use as a comparator, for example, in an ADC circuits.

SUMMARY OF THE INVENTION

An apparatus and method for performing an analog to digital conversation of an input signal is described. More specifically, a magnetoelectronic device is used as a comparator in the analog to digital conversation by taking advantage of the non-linear I–V characteristics of the magnetoelectronic device.

In one aspect, the present invention discloses an analog to digital converter for converting an analog input signal to a digital output signal, comprising a comparator circuit having first to $n^{th}$ stages of comparators responsive to the analog input signal. Each comparator is a magnetoelectronic device having one or more ferromagnetic elements capable of being switched into a first or second magnetization states. When the amplitude of analog input signal exceeds a threshold level ($I_S$ or $V_S$) of a comparator, the magnetization state is set to the first state and the resulting output of the comparator is a HIGH state, and vice-versa.

In another aspect, the present invention provides a method of converting an analog input signal to a digital output signal. The method includes the steps of providing a plurality of magnetoelectronic devices to perform a comparison function, each magnetoelectronic device including one or more ferromagnetic elements capable of being switched to a first or second magnetization states. Each magnetoelectronic device is enabled to set its magnetization state to a first HIGH state when the amplitude of the analog input signal exceeds a predetermined threshold, and vice-versa.

In another embodiment, the write wires through which the input current is applied to the HHE device are electrically isolated from the rest of the device and, in particular, are isolated from device output. Since the input write current is coupled inductively to the device, the capacitance is intrinsically low. It follows that a natural function of the HHE device is that of an electronic isolator. In the existing state of the art, high degrees of electrical isolation are typically provided opto-electronically. This approach is characterized by relatively low bandwidth and high operating power. Because it requires integrated light emitting diodes and photoreceptors, it is also characterized by low density of integration. A single HHE device can provide the isolation function with broad bandwidth. Because a single device is required, integration is high and power is low, and the HHE electrical isolator has significant advantages over the existing art.

While the invention has been herein shown and described in what is presently conceived to be the most practical and preferred embodiment, it will be apparent to those of ordinary skill in the art that many modifications may be made thereof within the scope of the invention, which scope is to be accorded the broadest interpretation of the appended claims so as to encompass all equivalent methods and apparatus.

BRIEF DESCRIPTION OF THE DRAWINGS

FIG. 2b shows analog input current of three different amplitudes, at constant frequency f, applied to the device input of the device as in FIG. 1a;

FIG. 7b is an exemplary amplitude modulated input signal applied to the subset of magnetoelectronic comparators as in FIG. 7a.

DETAILED DESCRIPTION OF THE EXEMPLARY EMBODIMENTS

Figure 1A:
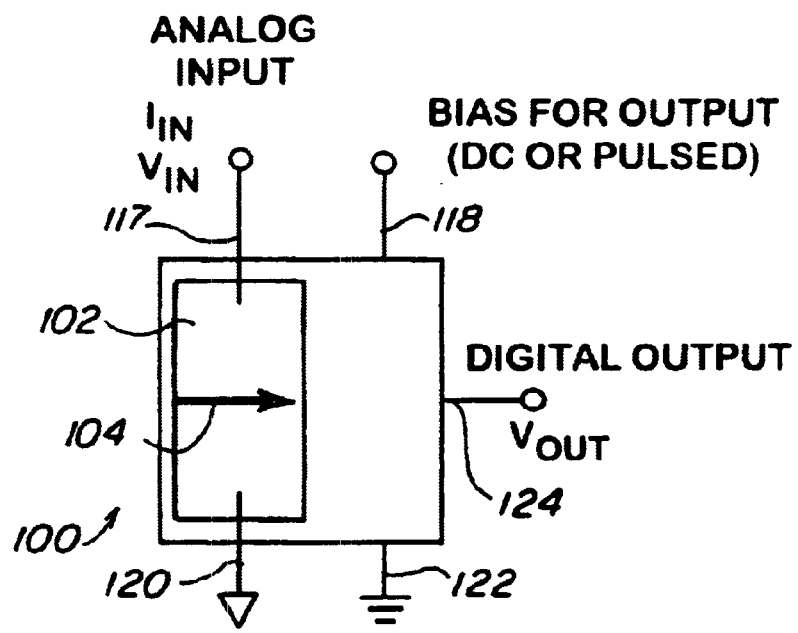
FIG. 1a is a schematic view of a generic magnetoelectronic device having bistable magnetization states, with orientation to the right.

Referring now to FIG. 1a, there is shown a schematic view of a generic magnetoelectronic device 100, defined as a device that incorporates a magnetic element 102 having an output voltage that depends on its magnetization state. Exemplary magnetic elements include spin valves, magnetic tunnel junctions (MTJs), and Hybrid Hall Effect (HHE) devices. The structure of the device 100 may include one or more ferromagnetic elements 102, but the operation of the device 100 typically depends on the manipulation of the magnetization 104 of the ferromagnetic element 102. The magnetization 104 has bistable states, with orientation to the right (positive x, FIG. 1a) or left (negative x, FIG. 1b). Binary information is associated with these bistable orientations. For example, "0" corresponding to left orientation and "1" corresponding to orientation to the right.

Figure 1B:
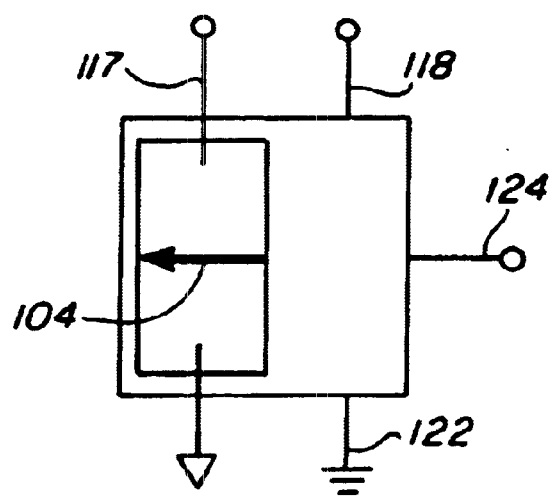
FIG. 1b is a schematic view of the magnetoelectronic device as in FIG. 1a having bistable magnetization states, but with orientation to the left.

The magnetization orientation 104 is controlled by applying current $I_{IN}$ (or voltage $V_{IN}$) to an input terminal of an integrated write wire 117, and sinking the input at ground 120. The write wire 117 is preferably fabricated to be contiguous with, and inductively coupled to, ferromagnetic element 102. Associated with input ("write") current $I_W$ is a local magnetic field $H_x$. For positive current $+I_W$, the field is $+H_W x$ and the magnetization orientation is set to the right as shown in FIG. 1a. For negative current $-I_x$, the field is $-H_W x$ and the magnetization orientation is set to the left as shown in FIG. 1b.

For digital applications, e.g., nonvolatile memory, the write operation is typically performed using current pulses with duration of the order of 10 nsec. Due to the bistability of the magnetization states, the orientation latches after the application of an appropriate write pulse. For non-volatile memory applications, readout bias is applied as a pulse of short duration. The state of the device 100 is read by applying a bias current (or voltage) to terminal 118 and sinking it to a ground 122. In general, the write wire 117 is electrically isolated from the rest of the device 100, and separate ground terminals 120 and 122 are used to maintain the isolation. The readout bias applied to terminal 118 develops a voltage (or current) at output terminal 124, and two discrete output values correspond to right (left) magnetization orientation and represent binary "1" ("0").

In one embodiment, the ferromagnetic element 102 is a HHE device wherein the output voltages of the device 100 are bipolar, having negative or positive polarity. In a second embodiment, the output voltages of device 100 are LOW (approximately zero) and HIGH. In a third embodiment, the output levels of the device 100 are relatively low and high, $IR_0$ and $I(R_0+\text{delta } R_0)$.

Figure 2A:
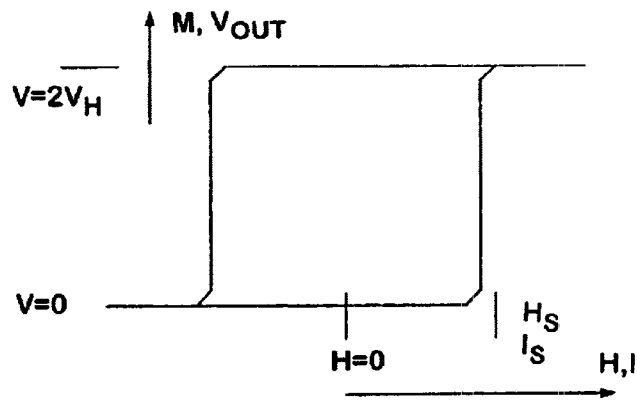
FIG. 2a depicts I–V operating characteristics of the magnetoelectronic device described with hysterisis loop.

The operating characteristics of a generic device 100 are described with the hysteresis loop of FIG. 2(a). The vertical axis represents the magnetization (along a chosen axis) of the ferromagnetic element and, because the output voltage is proportional to the magnetization state, the vertical axis also corresponds to the output voltage $V_{out}$. For magnetoresistive devices (e.g. spin valves and MTJs), the hysteretic output voltage is superposed on top of a finite background voltage.

For a Hybrid Hall effect device with symmetric voltage arms, the bipolar output levels correspond directly with positive and negative magnetization values. FIG. 2(a) is sketched for a Hybrid Hall effect device embodiment with HIGH and LOW output levels. The LOW voltage state corresponds to magnetization orientation to the left (negative along x̂), and V=0. The HIGH voltage state corresponds to magnetization orientation to the right (positive along x), and $V=2V_H$, where $V_H$ is the "local Hall" voltage. The horizontal axis represents magnetic field H applied along the axis of the element and, because the magnetic field of an inductively coupled write current is directly proportional to the current, the horizontal axis also represents input write current I.

For a magnetic element with a reasonably square hysteresis loop, a saturation field (current) $\pm H_S$ ($\pm I_S$) may be required to orient the magnetization to the right or left. FIG. 2(a) depicts I–V characteristic curve for the magnetoelectronic device as shown in FIG. 1. FIGS. 2(b)–(e) demonstrate how this I–V characteristics can be used to perform as a comparator in accordance with an exemplary embodiment of the present invention.

Figure 2B:
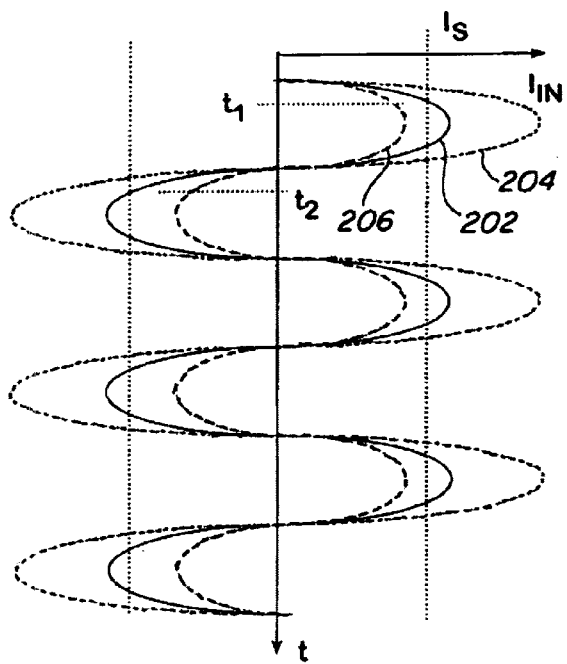
Figure 2C:
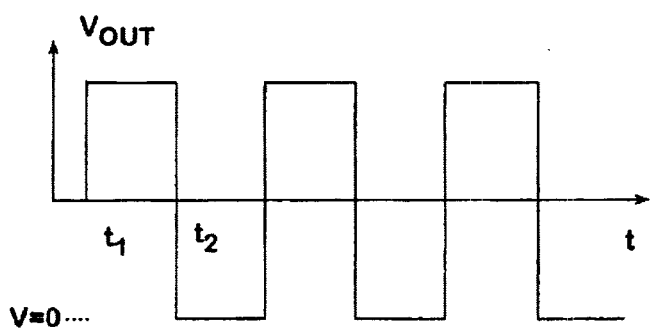
FIGS. 2c–2e show the output voltage observed under conditions of constant bias for different input amplitudes and demonstrate how the I–V characteristics as in FIG. 2a can be used to perform as a comparator in accordance with an exemplary embodiment of the present invention.

FIG. 2(b) represents analog input current of three different amplitudes, at constant frequency f, applied to the device input, terminal 117 in FIG. 1(a). FIG. 2(c) represents the output voltage at terminal 124, observed under conditions of constant bias applied to terminal 118, corresponding to the solid black input curve. At time $t_1$ the input current exceeds $I_S$, the magnetization orientation is set to the right, and the output level is HIGH. The output stays at this constant level until time $t_2$, when the input current has reversed along the top portion of the hysteresis loop and becomes less than $-I_S$. The magnetization orientation is set to the left and the output level shifts to LOW. The process continues for continuing cycles, and one notes that sine wave analog input is generating square wave output at the same frequency f.

Figure 2D:

FIG. 2(d) represents an exemplary output voltage at terminal 124 that corresponds to input curve 206. For example, for this diminished amplitude, the input current never exceeds $I_S$ and the magnetization state is never altered: if it began with magnetization to the left, the magnetization remains oriented to the left and the output voltage is always V=0.

Figure 2E:
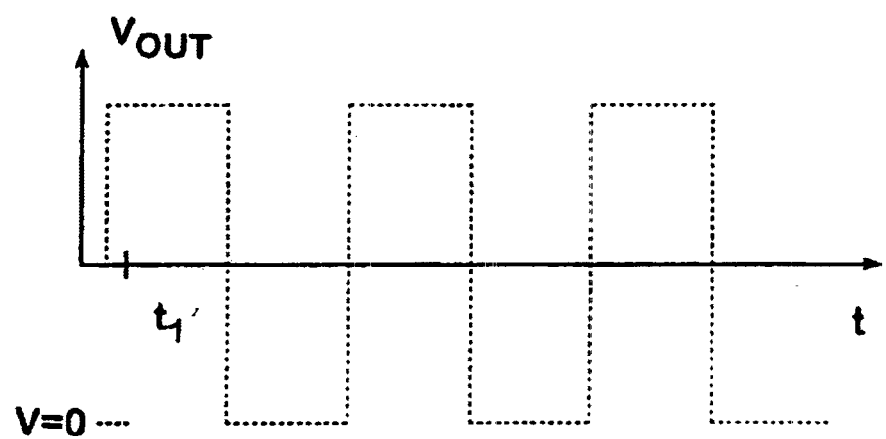

FIG. 2(e) represents an exemplary output voltage at terminal 32 that corresponds to input curve 204. For this relatively large amplitude, the input current exceeds the saturation value at a time slightly before $t_1$. The output voltage is a square wave with frequency f and with the same amplitude as that of FIG. 2(c). The output waveforms of FIGS. 2(c) and (e) differ by a small phase shift.

From the above and from FIGS. 2(c)–(e), one skilled in the art would appreciate that the magnetoelectronic device 100 is operating as a comparator. If the input amplitude exceeds a certain threshold level the output is a square wave with constant amplitude. If the input amplitude does not exceed the threshold level, the output is a constant level determined by the initial state which may be set to zero.

Figure 3:
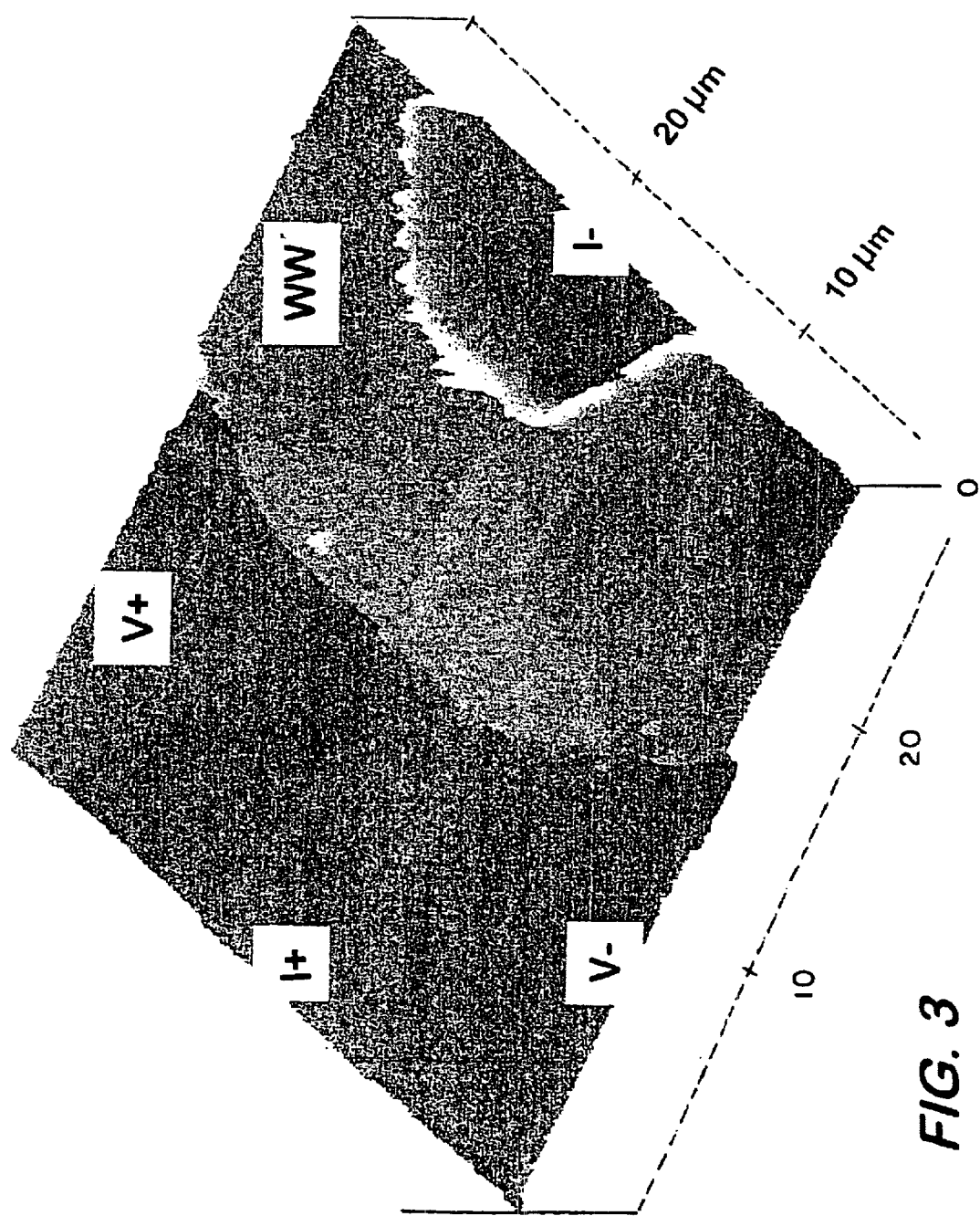
FIG. 3 shows an exemplary prototype of a hybrid Hall effect device.

An example of a prototype device is shown in FIG. 3, an AFM image of a 1.2 µm by 7.5 µm FeCo element F fabricated on a high mobility InAs Hall cross. The Hall cross was formed by optical lithography and a dry etch to define the mesa, and the 4 µm wide arms of the cross were then narrowed to 1 µm by radiation damage from a focused ion beam (FIB). A write wire (WW) fabricated from a Au film, about 12 µm wide and 100 nm thick, is electrically isolated from the ferromagnetic element and the axis of the write wire is perpendicular to the easy magnetization axis of F. Details of the fabrication and operation of HHE devices are outside the scope of the present invention and are therefore not described herein.

Figure 4:
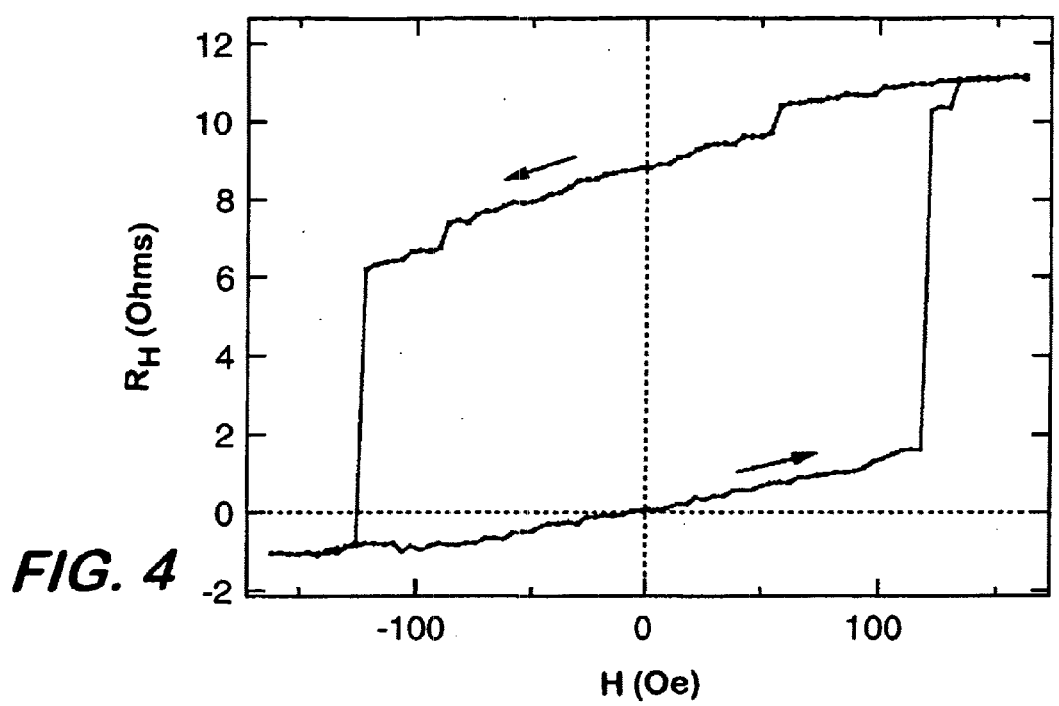
FIG. 4 shows quasistatic output characteristic (hysterisis loop) for the prototype device of FIG. 3.
Figure 5:
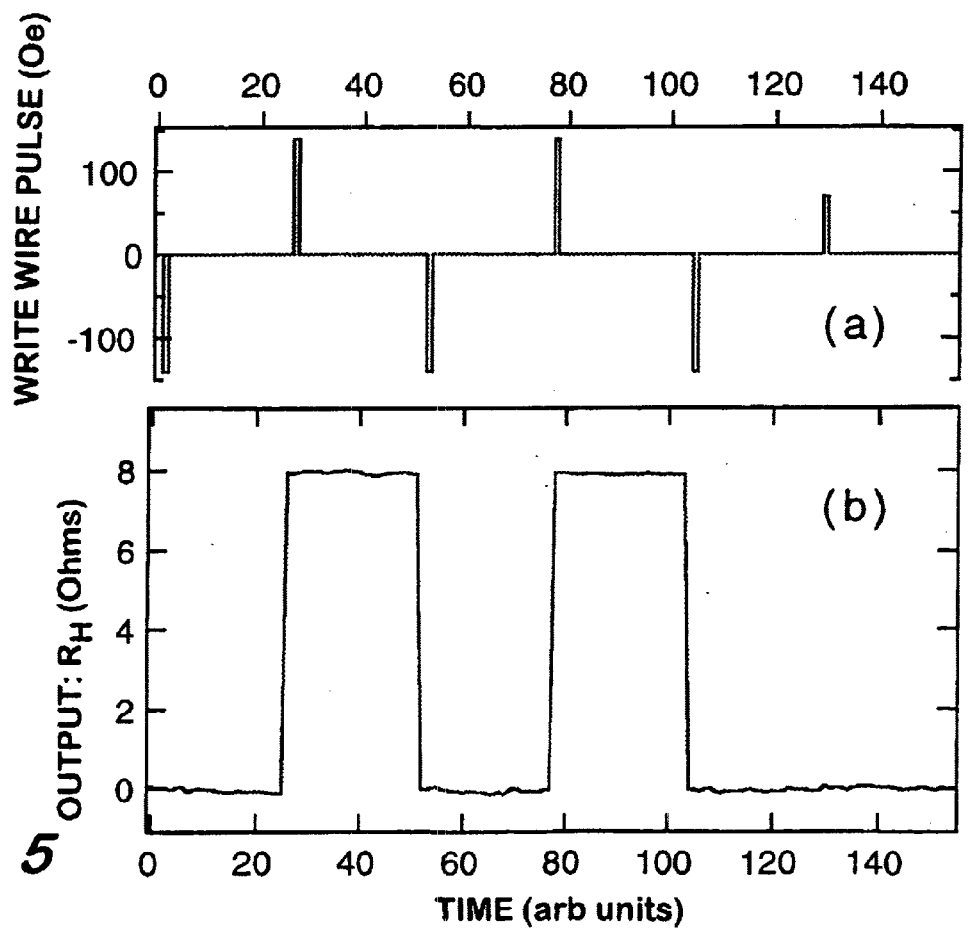
FIG. 5 is a response of the hybrid Hall effect device as in FIG. 3 to an input of write pulses.

The quasistatic output characteristic (hysteresis loop) for the prototype device of FIG. 3 is shown in FIG. 4. One would observe that the output characteristic of the prototype is similar to the idealized loop of FIG. 2(a). The bistable output levels depend linearly on the bias current and are given in units of resistance, $R_{LOW}=0$ and $R_{HIGH}=8.5$. The switching field is $|H_S|$ 140 Oe. The response of the HHE device of FIG. 3 to an input of write pulses is shown in FIG. 5. The device is biased with constant readout current, and the output voltage is recorded while input pulses $I_W$ are applied.

For write current amplitude $I_W=\pm 140$ Oe, the output toggles from LOW to HIGH values. When the write current amplitude is diminished to $I_W=70$ Oe, the input amplitude is below the switching value and the device remains in the previous state. For the data of FIG. 5, pulses of long duration (of the order 0.1 msec) were used. The dynamic response of the ferromagnetic element F is too fast to record with readily available electronic equipment, but can be measured with magneto-optic techniques.

Figure 6:
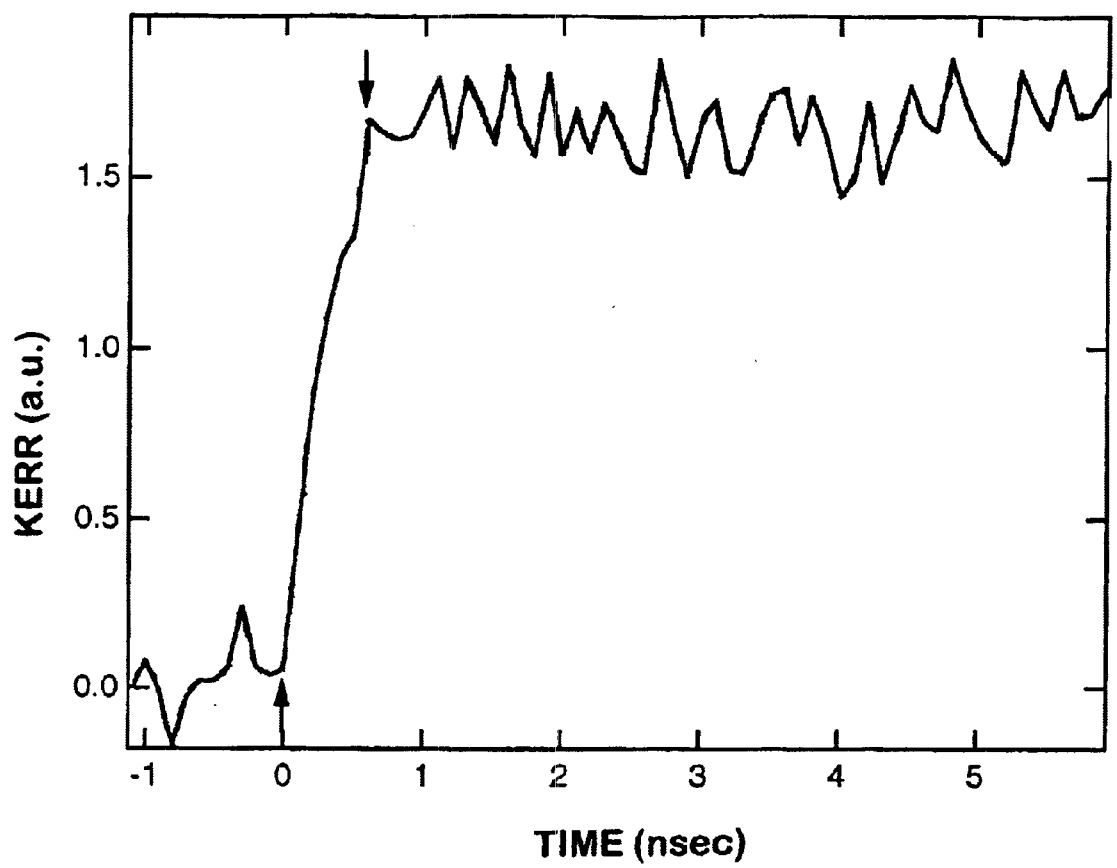
FIG. 6 is a response of the magnetization of a ferromagnetic element of the hybrid Hall effect device as in FIG. 3 to a single write pulse with a rise time of 300 psec and duration of 10 nsec.

A device similar to that of FIG. 3 was fabricated in the following way. Two perpendicular write wires, each made with Au films about 100 nm thick and 9 µm wide, are electrically isolated from each other and form the bottom layers. The ferromagnetic element F is fabricated on top, with the same composition as the device of FIG. 3, and with nearly identical dimensions: 1 µm by 7 µm by 40 nm thick. The write wires terminate 50 lines, and they are sufficiently short in length that high speed write pulses are transmitted with negligible deformation. The magnetization orientation of F is determined by a magneto-optic Kerr measurement synchronized with the application of the write pulses. The response of the magnetization of F to a single write pulse with a rise time of 300 psec and duration 10 nsec is shown in FIG. 6. The units of the vertical axis are arbitrary, with "0" corresponding to magnetization orientation along the initial, −x direction, and 1.6 representing magnetization orientation along +x. The magnetization reversal time $\tau_\pi$ is seen to be $\tau_\pi 500$ psec, nearly as fast as the rise time of the write pulse.

These preliminary measurements of $\tau_\pi$, for a single element of representative material and typical shape, demonstrate that the Hybrid Hall effect device can operate as a comparator with analog input bandwidth of approximately 1 GHz. The settling time of the device is expected to be short, and is not expected to limit device speed. Research on materials and device engineering will improve the dynamic response, and it's reasonable to expect order of magnitude increase of speed.

Figure 7A:
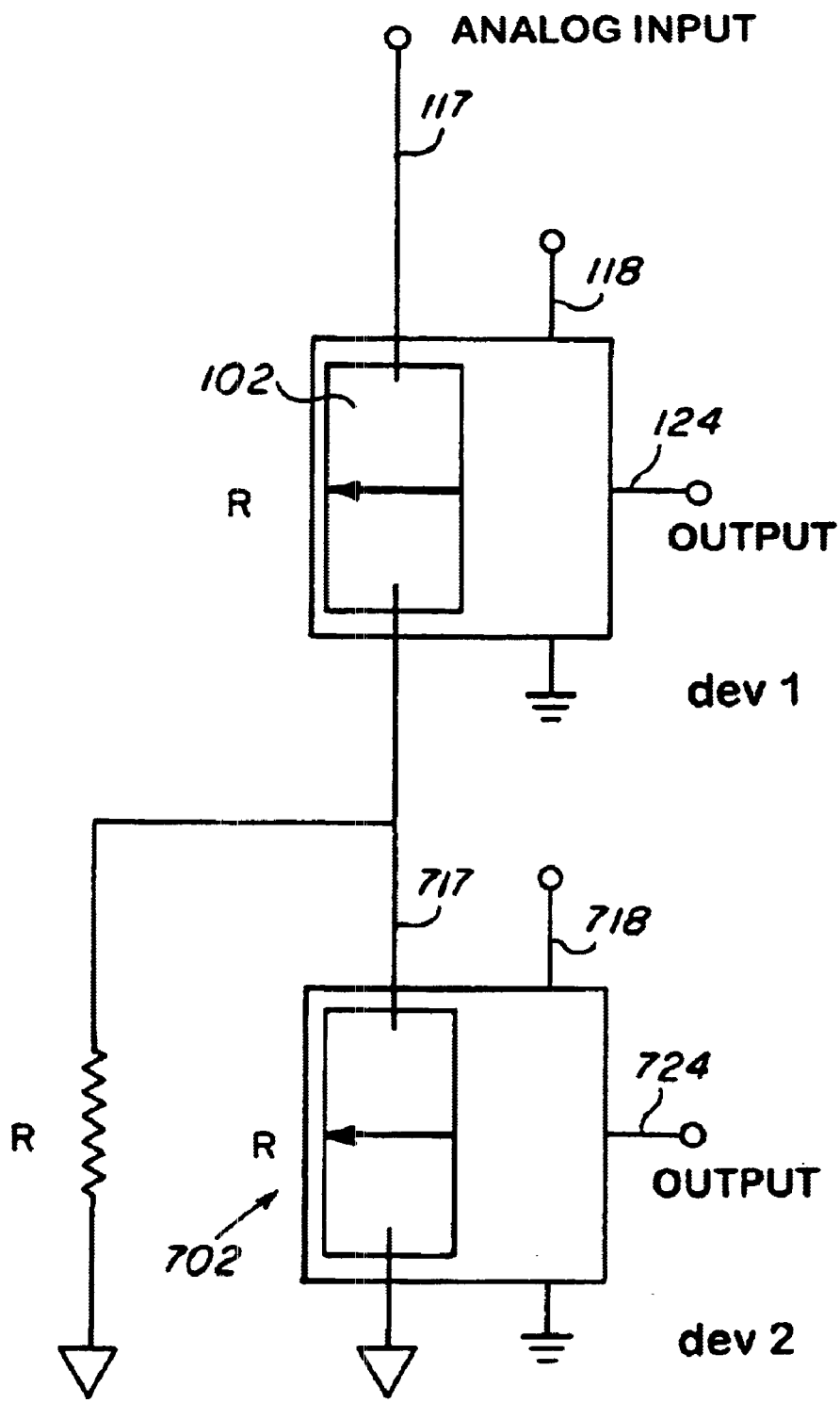
FIG. 7a shows a subset of two magnetoelectronic comparators (out of a set of $2^n-1$) for an exemplary analog-to-digital conversion of a single frequency sine wave input with n bit vertical resolution.

FIG. 7 depicts an architecture for using several of the magnetoelectronic devices to create an ADC. Although a prototype of Hybrid Hall device is presented, one skilled in the art will appreciate that a number of HHE embodiments, as well as a variety of magnetoelectronic devices such as spin valves and magnetic tunnel junctions, could also be used.

As a pedagogical model, FIG. 7 depicts a subset of 2 magnetoelectronic comparators (among a set of $2^n-1$) for the simple case of analog-to-digital conversion of a single frequency sine wave input with n-bit vertical resolution. It will be appreciated that the device parameters chosen here are exemplary and kept simple for convenience and simplicity. It will be appreciated that variations of parameters may improve operation but do not alter the basic concept.

In this simple model, the two devices are connected in series and are constantly biased for output while the analog input is applied to their common write wire. The series combination of magnetoelectronic devices (with current input) is equivalent to the parallel combination of CMOS op amps (with voltage input) in Flash A/D conversion. Assuming an impedance R for the input of each device, the analog input to device 2 is applied across a shunt resistor R so that half the current delivered to device 1 is applied to device 2. Equivalently, the width of write wire 717 could be fabricated to be double the width of write wire 117. Since the local field H scales with current density, the input field delivered to device 2 is half that delivered to device 1. One skilled in the art will appreciate that a variety of schemes can be used for connecting devices 1 and 2.

Figure 7B:
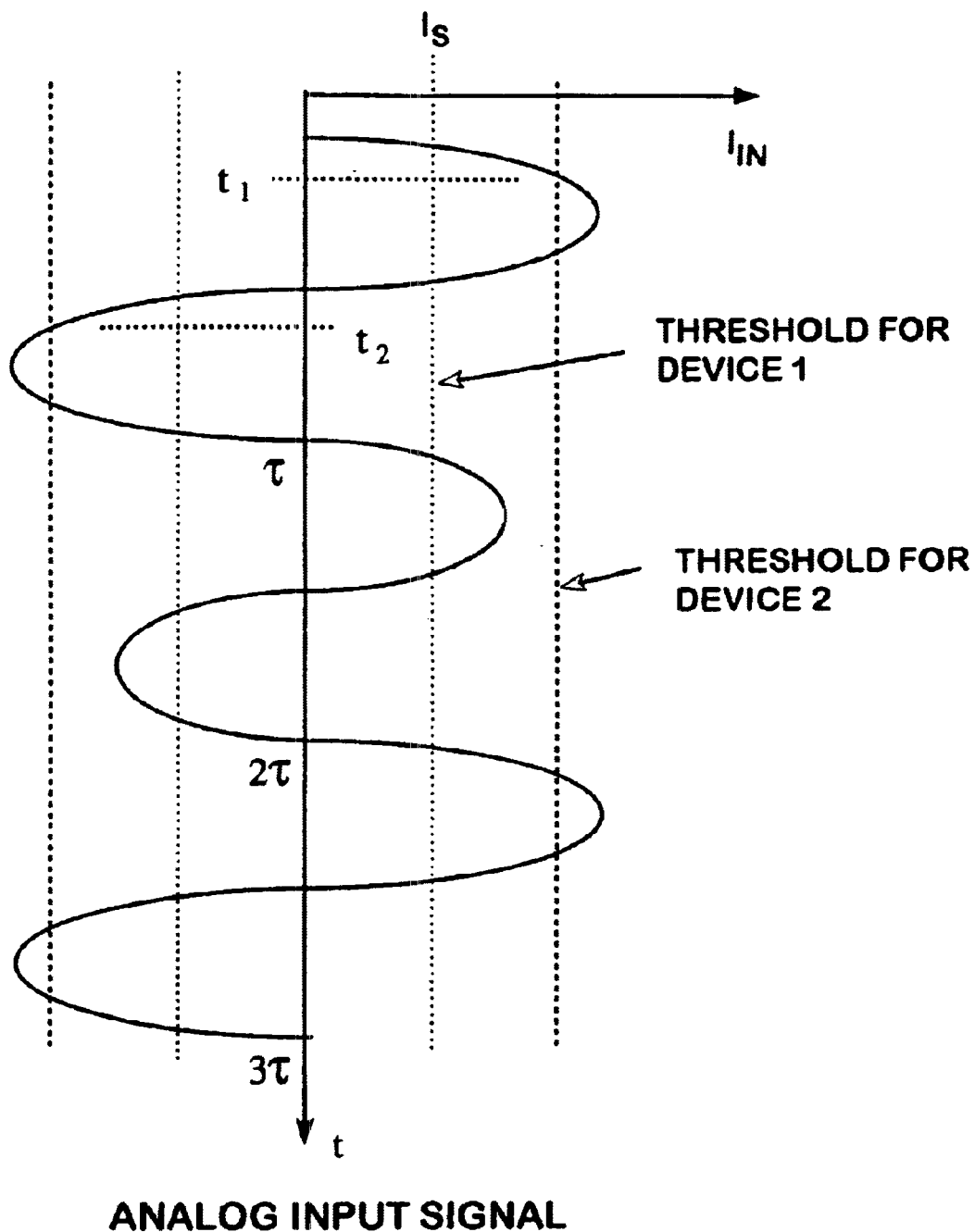
Figure 7C:
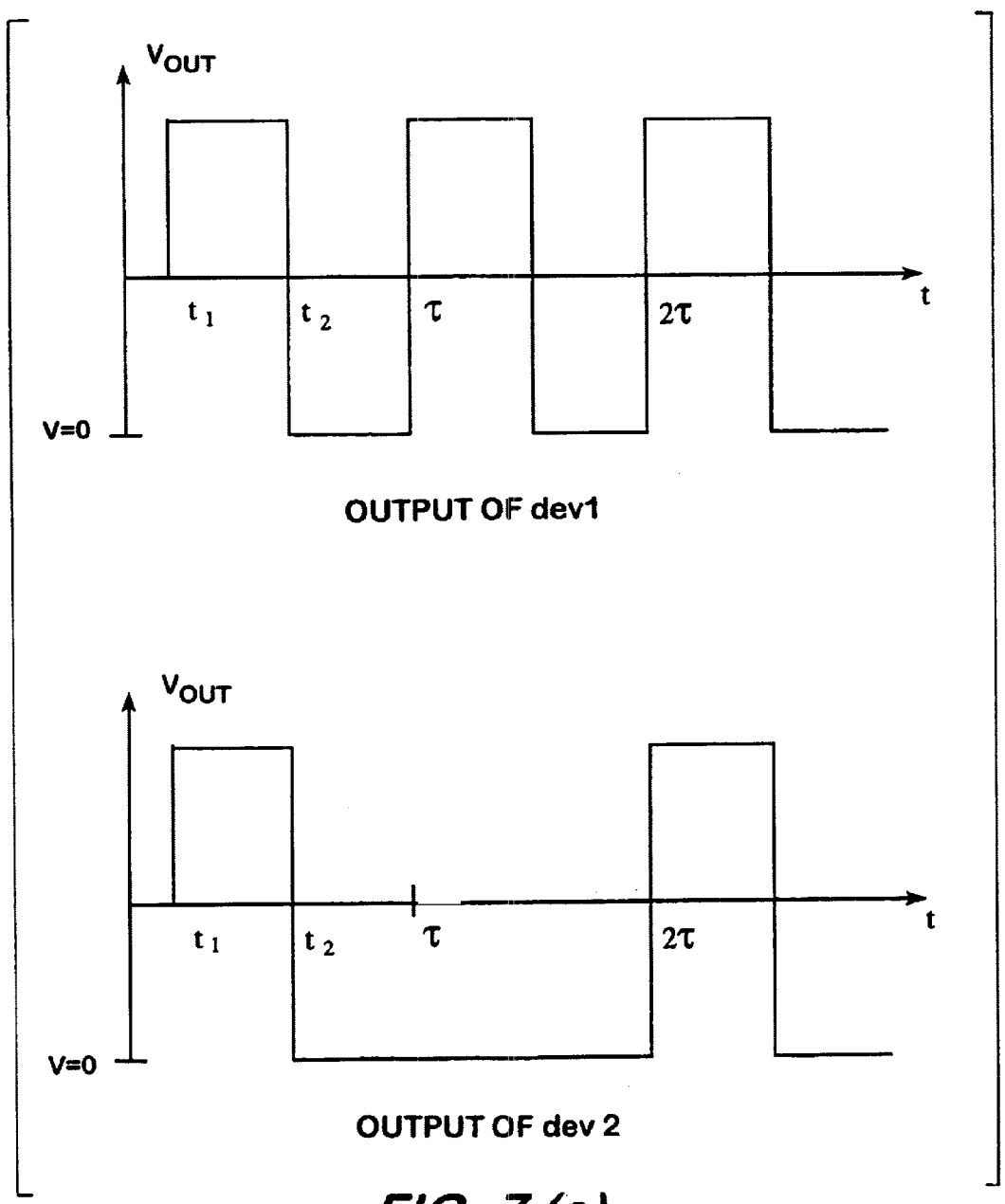
FIG. 7c is an output of devices 1 and 2, shown in FIG. 7a, for three periods of the input signal.

An example of an amplitude modulated input signal is shown in FIG. 7(b), where the amplitude during the second period ($\tau<t<2\tau$) is smaller than that during the first ($0<t<\tau$) or third periods ($2\tau<t<3\tau$). Devices 1 and 2 are fabricated with identical characteristics, and the value of write current $I_W$ that corresponds to the switching current $I_S$ is shown as the dotted line 706. The value $I_S$ represents the threshold value for switching the state of device 1. Since the input write current (or write field) applied to device 2 is half the value applied to device 1, the threshold for switching the state of device 2 is $2I_S$ (indicated by line 708). The output of devices 1 and 2 for three periods of the input signal are shown in FIG. 7(c).

For each of the three periods, the threshold of device 1 is exceeded and the output toggles between LOW and HIGH values. Small differences in phase associated with slightly retarded switching during the second period are not shown. For the first and third periods, the threshold of device 2 is exceeded and the output toggles between LOW and HIGH values. For the second period, the threshold is not exceeded and the device state is unchanged during the period, $V_{out}=0$.

The time sequenced output levels of devices 1 and 2 represent the digitized output levels of the comparators. The output of device 2 corresponds to a higher vertical level (e.g. level 2) and that of device 1 corresponds to a lower level (e.g. level 1). Then, for example, during the first period the digitized amplitude is [device 1, device 2]=[1, 1] and this represents an output of level 2. During the second period, the amplitude is [1,0] and this represents a level of 1. A cycle with analog amplitude less than $I_S$ would have digitized amplitude [0, 0] and this would represent zero amplitude. The time sequenced output levels of devices 1 and 2 are sent to decoder circuits that are known in the art.

Typically, for example, these decoders examine the sequence [comparator 1, comparator 2, . . . . comparator $2^n$]=[level 1, level 2, . . . level $2^n$] and look for the change from binary 1 to binary 0 to identify the appropriate digitized level. These techniques are known in the art. The subject of this disclosure is the invention of novel comparators and their use in ADC.

One skilled in the art will appreciate that approach set forth in the present invention can be generalized to n levels of digitized resolution. It is also clear that variations of this approach are equally viable. For example, rather than fabricate devices 1 and 2 with identical characteristics and dividing the input current (or current density) to device 2 by a factor of 1/2, it is equally possible to fabricate device 1 with an F element characterized by switching current $I_S$ and to fabricate device 2 with an F element characterized by switching current $2I_S$.

Advantages of the present invention include low operating power and low levels of integration (as relatively few devices are needed), thus offering a relatively inexpensive, low power alternative to existing CMOS technology. To provide a rough quantitative comparison, a typical state-of-the-art 12 bit ADC uses Bi-CMOS technology, provides conversion at 105 megasamples per second (MSPS), and uses 0.85 Watts of operating power. Based on existing prototypes, a 10-bit ADC designed using the present invention would operate with 1 Gigasamples per second (GSPS), and the core unit would have a peak operating power of about 0.4 Watts. The steady state power would be lower, but there would be additional power consumption (of the order of 0.5 Watts) from the decoding and output stages. Thus, the order of magnitude increases in bandwidth with no increase in power consumption. The new ADC operates with conversation rates of 6 to 10 GSPS and steady state power consumption that is less than 1 Watt.

Other advantages of the present invention include:

(1) The approach of the present invention is very simple. Relatively few devices are required, and it follows that the magnetoelectronic ADC (MADC) can be fabricated with small size, high density and relatively low expense.

(2) It requires low power. The peak operating power is expected to be about 0.4 mW per comparator.

(3) It has a broad bandwidth for analog input. The input bandwidth is expected to be at least 1 GHz and, with further research and development, may be as high as 20 GHz. Standard ADCs available today operate at roughly 0.1 GSPS, and the present invention may provide improvement by 1 to 2 orders of magnitude.

(4) It may be fabricated with III–V semiconductors, or with silicon technology (CMOS or silicon on oxide). The HHE device is readily fabricated using InAs or GaAs compound semiconductors, and the intrinsic compatibility with GaAs devices may be an advantage for telecommunications electronics.

(5) It is radiation hard.

(6) It is compatible with magnetoelectronic technology. Other magnetoelectronic devices, with functions such as reprogrammable logic or nonvolatile memory, can be fabricated on the same chip facilitating integration of a "system on a chip."

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A comparator, comprising:
   a magnetoelectronic device having one or more ferromagnetic elements capable of being switched into a first or second magnetization states;
   wherein amplitude of an input signal upon exceeding a predetermined threshold level sets a magnetization state of the magnetoelectronic device to the first magnetization state, and if the amplitude of the input signal is below the predetermined threshold level, the magnetization state of the magnetoelectronic device is set to the second magnetization state; and
   wherein the input signal has a duration of the order of 10 nsec.

2. The comparator as in claim 1, wherein the first magnetization state corresponds to a HIGH state.

3. The comparator as in claim 1, wherein the second magnetization state corresponds to a LOW state.

4. The comparator as in claim 1, wherein said magnetoelectronic device includes at least one input write wire.

5. The comparator as in claim 4, wherein said at least one input write wire is inductively coupled for input signals.

6. The comparator as in claim 1, wherein said magnetoelectronic device is a spin valve.

7. A comparator, comprising:
   a magnetoelectronic device having one or more ferromagnetic elements capable of being switched into a first or second magnetization states; and
   wherein amplitude of an input signal upon exceeding a predetermined threshold level sets a magnetization state of the magnetoelectronic device to the first magnetization state, and if the amplitude of the input signal is below the predetermined threshold level, the magnetization state of the magnetoelectronic device is set to the second magnetization state;
   wherein said magnetoelectronic device is a hybrid hall effect (HHE) device.

8. The comparator as in claim 7, wherein the first magnetization state corresponds to a HIGH state.

9. The comparator as in claim 7, wherein the second magnetization state corresponds to a LOW state.

10. The comparator as in claim 7, wherein said magnetoelectronic device includes at least one input write wire.

11. The comparator as in claim 10, wherein said at least one input write wire is inductively coupled for input signals.

12. A comparator, comprising:
    a magnetoelectronic device having one or more ferromagnetic elements capable of being switched into a first or second magnetization states; and
    wherein amplitude of an input signal upon exceeding a predetermined threshold level sets a magnetization state of the magnetoelectronic device to the first magnetization state, and if the amplitude of the input signal is below the predetermined threshold level, the magnetization state of the magnetoelectronic device is set to the second magnetization state;
    wherein said magnetoelectronic device is a magnetic tunnel junction device.

13. The comparator as in claim 12, wherein the first magnetization state corresponds to a HIGH state.

14. The comparator as in claim 12, wherein the second magnetization state corresponds to a LOW state.

15. The comparator as in claim 12, wherein said magnetoelectronic device includes at least one input write wire.

16. The comparator as in claim 15, wherein said at least one input write wire is inductively coupled for input signals.

17. An analog-to-digital converter for converting an analog input signal to a digital output signal, comprising:
    a comparator circuit having first to $n^{th}$ stages of comparators responsive to the analog input signal;
    each said comparator including a magnetoelectronic device having one or more ferromagnetic elements capable of being switched into a first or second magnetization states;

wherein amplitude of the analog input signal upon exceeding a predetermined threshold level sets a magnetization state of the magnetoelectronic device to the first magnetization state, and if the amplitude of the analog input signal is below the predetermined threshold level, the magnetization state of the magnetoelectronic device is set to the second magnetization state; and wherein analog input signal to set the first and second magnetization states has a duration of the order of 10 nsec.

18. The analog-to-digital converter as in claim 17, wherein the first magnetization state corresponds to a HIGH state.

19. The analog-to-digital converter as in claim 17, wherein the second magnetization state corresponds to a LOW state.

20. The analog-to-digital converter as in claim 17, wherein said magnetoelectronic device includes at least one input write wire.

21. The analog-to-digital converter as in claim 20, wherein said at least one input write wire is inductively coupled for input signals.

22. The analog-to-digital converter as in claim 17, wherein said magnetoelectronic device is a spin valve.

23. An analog-to-digital converter for converting an analog input signal to a digital output signal, comprising:

a comparator circuit having first to $n^{th}$ stages of comparators responsive to the analog input signal;

each said comparator including a magnetoelectronic device having one or more ferromagnetic elements capable of being switched into a first or second magnetization states;

wherein amplitude of the analog input signal upon exceeding a predetermined threshold level sets a magnetization state of the magnetoelectronic device to the first magnetization state, and if the amplitude of the analog input signal is below the predetermined threshold level, the magnetization state of the magnetoelectronic device is set to the second magnetization state; and wherein said magnetoelectronic device is a hybrid hall effect (HHE) device.

24. The analog-to-digital converter as in claim 23, wherein the first magnetization state corresponds to a HIGH state.

25. The analog-to-digital converter as in claim 23, wherein the second magnetization state corresponds to a LOW state.

26. The analog-to-digital converter as in claim 23, wherein said magnetoelectronic device includes at least one input write wire.

27. The analog-to-digital converter as in claim 26, wherein said at least one input write wire is inductively coupled for input signals.

28. An analog-to-digital converter for converting an analog input signal to a digital output signal, comprising:

a comparator circuit having first to $n^{th}$ stages of comparators responsive to the analog input signal;

each said comparator including a magnetoelectronic device having one or more ferromagnetic elements capable of being switched into a first or second magnetization states;

wherein amplitude of the analog input signal upon exceeding a predetermined threshold level sets a magnetization state of the magnetoelectronic device to the first magnetization state, and if the amplitude of the analog input signal is below the predetermined threshold level, the magnetization state of the magnetoelectronic device is set to the second magnetization state; and wherein said magnetoelectronic device is a magnetic tunnel junction device.

29. The analog-to-digital converter as in claim 28, wherein the first magnetization state corresponds to a HIGH state.

30. The analog-to-digital converter as in claim 28, wherein the second magnetization state corresponds to a LOW state.

31. The analog-to-digital converter as in claim 28, wherein said magnetoelectronic device includes at least one input write wire.

32. The analog-to-digital converter as in claim 31, wherein said at least one input write wire is inductively coupled for input signals.

33. A method of converting an analog input signal to a digital output signal, the method comprising:

providing a magnetoelectronic device to perform a comparison function, said magnetoelectronic device including one or more ferromagnetic elements capable of being switched to a first or second magnetization states;

enabling the magnetization state of said magnetoelectronic device to be set to the first magnetization state when amplitude of the analog input signal exceeds a predetermined threshold, the first magnetization state corresponding to a HIGH or "1"; and enabling the magnetization state of said magnetoelectronic device to be set to the second magnetization state when amplitude of the input signal is lower than the predetermined threshold, the second magnetization state corresponding to a LOW or "0";

wherein said magnetoelectronic device is a hybrid hall effect (HHE) device.

34. A method of converting an analog input signal to a digital output signal, the method comprising:

providing a magnetoelectronic device to perform a comparison function, said magnetoelectronic device including one or more ferromagnetic elements capable of being switched to a first or second magnetization states;

enabling the magnetization state of said magnetoelectronic device to be set to the first magnetization state when amplitude of the analog input signal exceeds a predetermined threshold, the first magnetization state corresponding to a HIGH or "1"; and enabling the magnetization state of said magnetoelectronic device to be set to the second magnetization state when amplitude of the input signal is lower than the predetermined threshold, the second magnetization state corresponding to a LOW or "0";

wherein said magnetoelectronic device is a magnetic tunnel junction device.

35. A method of converting an analog input signal to a digital output signal, the method comprising:

providing a magnetoelectronic device to perform a comparison function, said magnetoelectronic device including one or more ferromagnetic elements capable of being switched to a first or second magnetization states;

enabling the magnetization state of said magnetoelectronic device to be set to the first magnetization state when amplitude of the analog input signal exceeds a predetermined threshold, the first magnetization state corresponding to a HIGH or "1"; and enabling the magnetization state of said magnetoelectronic device to be set to the second magnetization state when amplitude of the input signal is lower than the predetermined threshold, the second magnetization state corresponding to a LOW or "0";

wherein analog input signal to set the first and second magnetization states has a duration of the order of 10 nsec.

36. The method as in claim 35, wherein said magnetoelectronic device is a spin valve.

37. An analog-to-digital converter for converting an analog input signal to a digital output signal, comprising:

a comparator circuit having first to $n^{th}$ stages of comparators responsive to the analog input signal;

each said comparator includes a Hybrid Hall Effect device having bistable output levels that are capable of being switched from a first magnetization state to a second magnetization state depending on amplitude of the input signal; and wherein when amplitude of the input signal exceeds a switching value of the Hall effect device, the output of the Hall effect device is switched to a HIGH state from a LOW state.

38. The analog-to-digital converter as in claim 37, wherein output voltages of hybrid Hall effect device are bipolar having negative or positive polarity.

39. A method of converting an analog signal to a digital signal, the method comprising:

providing a comparator circuit having first to $n^{th}$ stages of comparators responsive to the analog signal, wherein each said comparator is a Hybrid Hall Effect device having bistable output levels that are capable of being switched from a first magnetization state to a second magnetization state depending on the amplitude of the analog signal; and switching the output level of the Hall Effect device to a HIGH state from a LOW state if the amplitude of analog signal exceeds a predetermined switching value of the HHHall Effect device.

40. An isolator for providing isolation between two circuits, comprising:

a Hybrid Hall Effect device, having one or more ferromagnetic elements, with output levels of voltage or current that vary according to magnetization states of the one or more ferromagnetic elements;

one or more integrated write wires electrically isolated from the Hybrid Hall Effect device such that electrical signals in said one or more write wires are inductively coupled to the one or more ferromagnetic elements of the Hybrid Hall Effect device; and whereby resulting capacitance of said Hybrid Hall Effect device is intrinsically low.

41. The isolator according to claim 40, wherein the magnetization states include a first magnetization state with right magnetization orientation and a second magnetization state with a left magnetization orientation.

42. The isolator according to claim 41, wherein the right magnetization orientation represents a binary "1" and the left magnetization orientation represents a binary "0".

* * * * *